US012395141B2

(12) United States Patent
Figotin et al.

(10) Patent No.: US 12,395,141 B2
(45) Date of Patent: Aug. 19, 2025

(54) SENSING CIRCUIT

(71) Applicant: THE REGENTS OF THE UNIVERSITY OF CALIFORNIA, Oakland, CA (US)

(72) Inventors: Alexander Figotin, Irvine, CA (US); Filippo Capolino, Irvine, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 252 days.

(21) Appl. No.: 18/196,202

(22) Filed: May 11, 2023

(65) Prior Publication Data
US 2023/0361742 A1    Nov. 9, 2023

Related U.S. Application Data

(63) Continuation of application No. PCT/US2021/059365, filed on Nov. 15, 2021.

(60) Provisional application No. 63/114,683, filed on Nov. 17, 2020.

(51) Int. Cl.
*H03H 7/00* (2006.01)
*H03H 7/01* (2006.01)

(52) U.S. Cl.
CPC .......... *H03H 7/002* (2013.01); *H03H 7/0115* (2013.01)

(58) Field of Classification Search
CPC ............................ H03H 7/002; H03H 7/0115
USPC ......................................... 333/175, 213–215
See application file for complete search history.

(56) References Cited

U.S. PATENT DOCUMENTS

| | | | |
|---|---|---|---|
| 3,517,342 A | 6/1970 | Orchard et al. | |
| 3,713,050 A | 1/1973 | Golembeski | |
| 4,381,489 A | 4/1983 | Canning et al. | |
| 10,178,735 B1 | 1/2019 | Jankovic et al. | |
| 10,415,970 B2 | 9/2019 | Khajavikhan et al. | |
| 2001/0054943 A1* | 12/2001 | Takeda ................ | H01P 1/20372 333/204 |
| 2018/0261977 A1 | 9/2018 | Feng et al. | |
| 2020/0012008 A1 | 1/2020 | Chen et al. | |

FOREIGN PATENT DOCUMENTS

| | | |
|---|---|---|
| DE | 2 229 494 A1 | 1/1974 |
| DE | 2 314 418 A1 | 10/1974 |
| WO | WO 2018/213410 A1 | 11/2018 |

(Continued)

OTHER PUBLICATIONS

WO, PCT/US21/59365 ISR and Written Opinion, Feb. 9, 2022.
(Continued)

*Primary Examiner* — Rakesh B Patel
(74) *Attorney, Agent, or Firm* — ONE LLP

(57) ABSTRACT

Disclosed are example embodiments of a circuit comprising a first inductor-capacitor (LC) loop, a second LC loop having at least one of a series connection or parallel connection to the first LC loop, and a gyrator coupled between the first LC loop and the second LC loop. In an example, the first LC and the second LC loop each include an inductive element (L) and a capacitive (C) element coupled to each other in series. In another example, the first LC and the second LC loop each include an inductive element (L) and a capacitive (C) element coupled to each other in parallel.

11 Claims, 2 Drawing Sheets

(56) References Cited

FOREIGN PATENT DOCUMENTS

WO    WO 2019/232133 A1    12/2019

OTHER PUBLICATIONS

Chen, P.Y., et al., "Generalized parity-time symmetry condition for enhanced sensor telemetry", 2018, retrieved from https://arxiv.org/ftp/arxiv/papers/1812/1812.08296.pdf, pp. 1-45.

Figotin, A., "Synthesis of Lossless Electric Circuits Based on Prescribed Jordan Forms", 2020, retrieved from https://arxiv.org/pdf/2007.02143.pdf, pp. 1-42.

Kazemi, H., et al., "Ultra-Sensitive Radio Frequency Biosensor at an Exceptional Point of Degeneracy induced by time modulation", 2019, retrieved from https://arxiv.org/pdf/1909.03344.pdf, pp. 1-9.

Kazemi, H., et al., "Experimental Demonstration of Exceptional Points of Degeneracy in Linear Time Periodic Systems and Exceptional Sensitivity", 2019, retrieved from https://arxiv.org/pdf/1908.08516.pdf, pp. 1-12.

Kazemi, H., et al., "Exceptional Points of Degeneracy Induced by Linear Time-Periodic Variation", Physical Review Applied, 2019, vol. 11, pp. 014007-1-014007-10.

Sakhdari, M., et al., "Ultrasensitive, Parity-Time-Symmetric Wireless Reactive and Resistive Sensors", IEEE Sensors Journal, 2018, vol. 18, No. 23, pp. 9548-9555.

Schindler, J., et al., "Experimental Study of Active LRC Circuits with PT Symmetries", 2011, retrieved from https://arxiv.org/pdf/1109.2913.pdf, pp. 1-4.

Stehmann, T., et al., "Observation of Exceptional Points in Electronic Circuits", 2003, retrieved from https://arxiv.org/pdf/quant-ph/0312182.pdf, pp. 1-4.

Wiersig, J., "Enhancing the Sensitivity of Frequency and Energy Splitting Detection by Using Exceptional Points: Application to Microcavity Sensors for Single-Particle Detection", Phys. Rev. Lett., 2014, vol. 112, No. 20, pp. 203901-1-203901-5.

Wiersig, J., "Sensors operating at exceptional points: General theory", Physical Review A, 2016, vol. 93, pp. 033809-1-033809-9.

* cited by examiner

SENSING CIRCUIT

CROSS-REFERENCE TO RELATED APPLICATIONS

This application is a continuation of International Patent Application Serial No. PCT/US21/59365, filed Nov. 15, 2021, which claims the benefit of priority under 35 U.S.C. § 119(e) from U.S. Provisional Application Ser. No. 63/114,683, entitled "SENSING CIRCUIT" filed Nov. 17, 2020, both of which are hereby incorporated by reference in their entireties for all purposes.

STATEMENT REGARDING FEDERALLY SPONSORED RESEARCH

This invention was made with Government support under Grant No. FA9550-19-1-0103 awarded by the Air Force of Scientific Research (AFOSR); Grant No. ECCS 1711975, awarded by the National Science Foundation (NSF). The Government has certain rights in the invention.

TECHNICAL FIELD

The disclosure relates generally to the field of circuits for sensing, and not by way of limitation, some embodiments relate to a circuit made of two or more resonators and a gyrator.

BACKGROUND

There is a great demand for sensing of a variety of signals. For example, sensing and data acquisition is an important part of many medical, industrial, and automotive applications that require sensing of local physical, biological, or chemical quantities. For instance, acceleration sensors, pressure sensors, temperature sensors, humidity sensors, and biosensors have gained a lot of interest in recent years. When informative signals are small, enhanced sensitivity may be required to utilize them. Previous circuits with enhanced sensitivity may be costly or difficult to make. Accordingly, it may be advantageous to design low cost and highly sensitive electromagnetic (EM) sensing systems to precisely measure very small signals.

SUMMARY

A circuit is disclosed comprising a first inductor-capacitor (LC) loop, a second LC loop with at least a series connection or parallel connection, and a gyrator coupled between the first LC loop and the second LC loop.

A sensor is disclosed whose electronic circuits comprise: a plurality of LC loops; and a gyrator coupled between a first LC loop and a second LC loop of the plurality of LC loops, wherein the inductance and capacitance of each of the plurality of LC loops and the gyrator resistance is selected such that the sensor operates at, or close to, an exceptional point of degeneracy.

BRIEF DESCRIPTION OF THE DRAWINGS

The foregoing summary, as well as the following detailed description, is better understood when read in conjunction with the accompanying drawings. The accompanying drawings, which are incorporated herein and form part of the specification, illustrate a plurality of embodiments and, together with the description, further serve to explain the principles involved and to enable a person skilled in the relevant art(s) to make and use the disclosed technologies.

Figure 1:
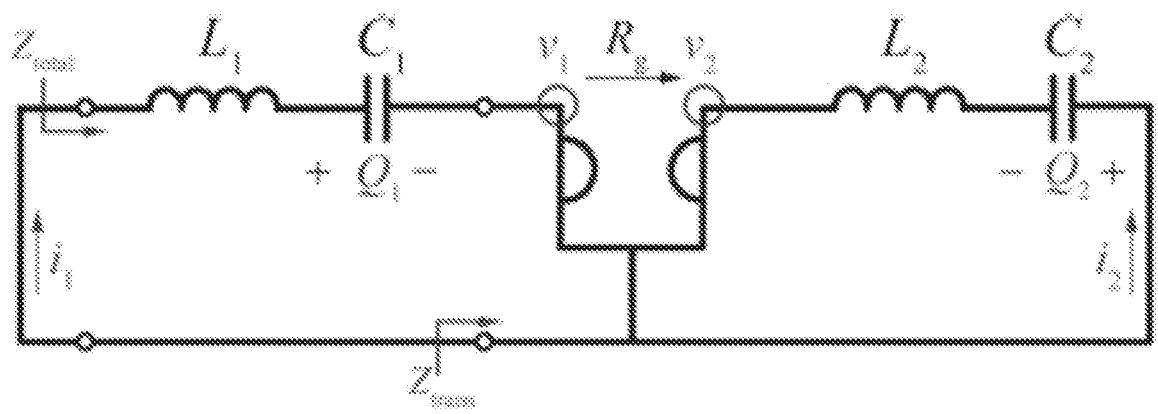
FIG. 1 is a diagram illustrating an example circuit in accordance with the systems and methods described herein.

The figures and the following description describe certain embodiments by way of illustration only. One skilled in the art will readily recognize from the following description that alternative embodiments of the structures and methods illustrated herein may be employed without departing from the principles described herein. In other words, there are variations of the two sample embodiment figures that are equivalent to the illustrated embodiments in terms of exceptional points occurrence and functionality related to the enhanced sensitivity here discussed. Reference will now be made in detail to several embodiments, examples of which are illustrated in the accompanying figures. It is noted that wherever practicable similar or like reference numbers may be used in the figures to indicate similar or like functionality.

DETAILED DESCRIPTION

The detailed description set forth below in connection with the appended drawings is intended as a description of configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details.

Several aspects of sensing circuits will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware in some embodiments.

Disclosed herein are systems for sensing circuits. In one system, a sensing circuit is disclosed, which includes: two LC loops (e.g., two LC resonators) and a gyrator that couples them, where "L" refers to an inductor (or multiple inductors), and C refers to a capacitor (or multiple capacitors).

In some embodiments, an example circuit may have two series LC resonators coupled by a gyrator. In some other embodiments, another example circuit may have two parallel LC resonators and a gyrator that couples the two parallel LC resonators. In an example embodiment, each LC loop may include an inductive element and a capacitive element coupled in series. In another example embodiment, each LC loop may include an inductive element and a capacitive element coupled in parallel.

In an example, the circuits may include two LC loops and a gyrator. Additionally, the circuit may be configured so that the Jordan form of the circuit's evolution matrix has nontrivial Jordan blocks indicating the eigenvector degeneracy. Such a state of the circuit, e.g., when eigenvectors coalesce, is called an exceptional point of degeneracy and abbreviated as EPD.

Each of the inductances and/or the capacitances may take positive values or negative values. The gyrator resistance may be selected so that the circuit is at an EPD state or in a neighborhood of an EPD state. In an example embodiment, the occurrence of the EPD state or proximity to it may make the circuit very sensitive to perturbations. In some embodiments, the circuit, by design may operate not at an EPD, but in a proximity to it.

In some embodiments, the circuit may include two LC loops. The first LC loop may include a first inductive element and a first capacitive element, and the second LC loop may include a second inductive element and a second capacitive element. In an example embodiment, two of these elements may have negative values.

In some embodiments, the L elements and the C elements may be coupled in series. In other embodiments the L elements and the C elements may be coupled in parallel. The first LC loop may include a first inductive element and a first capacitive element. The second LC loop may include a second inductive element and a second capacitive element. Two of these elements may have negative values. The two LC loops, either coupled in series or in parallel, may be coupled together by a gyrator.

As discussed above, there may be a great demand for sensing of a variety of signals. For example, sensing and data acquisition may be an important part of many medical, industrial, and automotive applications that require sensing of local physical, biological or chemical quantities. For instance, acceleration sensors, pressure sensors, temperature sensors, humidity sensors, and biosensors have gained a lot of interest in recent years. When informative signals are small, an enhanced sensitivity may be required to utilize them. The disclosed circuits of enhanced sensitivity based on exceptional points of degeneracy (EPD) have a potential to become an inexpensive choice for sensing very small signals of different kinds. The disclosed circuits are some of the simplest systems exhibiting EPD, thus enabling the disclosed circuits to be mass produced.

Disclosed herein are various low cost and highly sensitive electromagnetic (EM) sensing systems to precisely measure very small signals. When the frequency of a signal is sufficiently low (e.g., up to hundreds of MHz), one of the easiest ways to generate circuits for processing such signals is to use standard technology based on operational amplifiers (e.g., "Op Amps"). The disclosed circuit can be used in electronic parts of sensors working from a few kilohertz to a few gigahertz using standard components. The basic idea may also be generalized to higher frequencies depending on the proper choice of components that may provide a quality factor, either by choosing high quality factor passive components or by using active components to compensate for losses.

In one example of the disclosed circuits, a resonance frequency shift, due to the measurement related perturbation of the circuit's resonator, may provide for enhanced sensitivity when the circuit operates in close proximity of the EPD condition. What makes the disclosed circuit special in the class of sensors based on EPDs is their exceptional simplicity which implies relative ease of fabrication and low cost.

The disclosed circuits may include capacitors, e.g., of positive capacitances and/or negative capacitances; inductors, e.g., of positive inductances and/or negative inductances; and gyrators. To have the desired properties, the circuits may have the specific values of the involved elements, e.g., inductors, capacitors, and gyrators, as described in detail below. In other words, a circuit having these components does not automatically exhibit an EPD, but a very specific choice of components may need to be made to operate at the EPD. Furthermore, these circuits are one of the simplest physical systems with EPD.

FIG. 1 is a diagram illustrating an example circuit in accordance with the systems and methods described herein. In the example embodiment of FIG. 1, a principal circuit with two LC loops is connected by a gyrator. The example is a series-series configuration. In the series-series configuration scheme the two LC circuits are connected in series, but other circuit topologies are possible for the two LC circuits connected by a gyrator.

Considering the series LC circuits as in FIG. 1, the values of the circuit components need to satisfy the values provided in the following. The values may be found by first defining a state vector:

$$X(t) = [Q_1, Q_2, \dot{Q}_1, \dot{Q}_2],$$

where the dot represents time derivative, whose evolution is described by the linear system $$\frac{d}{dt} X(t) = MX(t)$$

where $M = \begin{pmatrix} 0 & 0 & 1 & 0 \\ 0 & 0 & 0 & 1 \\ -\omega_{01}^2 & 0 & 0 & \frac{R_g}{L_1} \\ 0 & -\omega_{02}^2 & -\frac{R_g}{L_2} & 0 \end{pmatrix}$, $\omega_{01}^2 = \frac{1}{L_1 C_1}$, $\omega_{02}^2 = \frac{1}{L_2 C_2}$ and $R_g$ is the gyration resistance. The relevant eigenvalue problem is defined in the Laplace domain as $sX(s) = MX(s)$, where $s = j\omega$. The corresponding characteristic equation is $$P(s) = s^4 + \left(\omega_{01}^2 + \omega_{02}^2 + \frac{R_g^2}{L_1 L_2}\right) s^2 + \omega_{01}^2 \omega_{02}^2 = 0. \tag{A0}$$

The ultimate condition for the degeneracy of the eigenvalues and the roots of the characteristic polynomial is $$\frac{R_g^4}{(L_1 L_2)^2} + 2(\omega_{01}^2 + \omega_{02}^2) \frac{R_g^2}{L_1 L_2} + (\omega_{01}^2 - \omega_{02}^2) = 0. \tag{A1}$$

The constrains on the values to satisfy the above equations are $$sgn(\omega_{01}^2) = sgn(\omega_{02}^2) = -sgn(L_1 L_2) = \pm 1. \tag{A1a}$$

Equivalently, the above constraint is written as $$sgn(C_1) = -sgn(L_2), sgn(L_1) = -sgn(C_2). \tag{A1b}$$

The second condition for the degeneracy and hence an EPD regime is that the gyration parameter $R_g$ has to satisfy the following condition $$R_g^2 = (|\omega_{01}| \pm |\omega_{02}|)^2 |L_1 L_2| \tag{A2}$$

Figure 2:
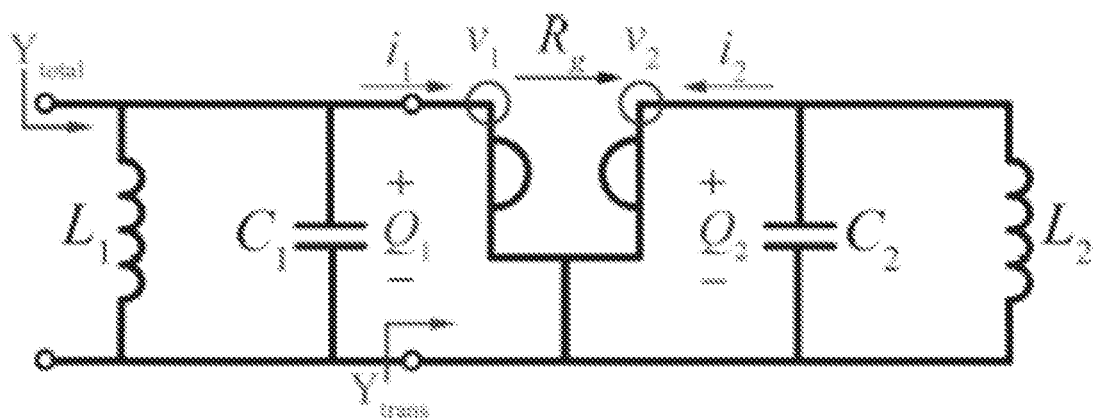
FIG. 2 is another diagram illustrating an example circuit in accordance with the systems and methods described herein.

FIG. 2 is another diagram illustrating an example circuit in accordance with the systems and methods described herein. The example embodiment of FIG. 2. illustrates a parallel-parallel configuration. In the parallel-parallel configuration, the two LC loops may be connected in parallel and coupled by a gyrator. In an example, two reactive elements may have negative values.

Considering the parallel LC circuits as in FIG. 2, the values of the circuit components may need to satisfy the values provided in the following. The following formulas may be found using a procedure analogous to the one in the previous item, e.g., described with respect to FIG. 1. The corresponding characteristic equation is $$P(s) = s^4 + \left(\omega_{01}^2 + \omega_{02}^2 + \frac{1}{R_g^2 C_1 C_2}\right) s^2 + \omega_{01}^2 \omega_{02}^2 = 0 \quad (B0)$$

The ultimate condition for the degeneracy of the eigenvalues and the roots of the characteristic polynomial is $$\frac{1}{R_g^4 (C_1 C_2)^2} + 2(\omega_{01}^2 + \omega_{02}^2) \frac{1}{R_g^2 C_1 C_2} + (\omega_{01}^2 - \omega_{02}^2) = 0 \quad (B1)$$

The constrains on the values to satisfy the above equations are $$sgn(\omega_{01}^2) = sgn(\omega_{02}^2) = -sgn(C_1 C_2) = \pm 1 \quad (B1a)$$

Equivalently, the above constraint is written as $$sgn(C_1) = -sgn(L_2), sgn(L_1) = -sgn(C_2), \quad (B1b)$$

The second condition for the degeneracy and hence an EPD regime is that the gyration parameter $R_g$ has to satisfy the following condition $$R_g^2 = [(|\omega_{01}| \pm |\omega_{02}|)^2 |C_1 C_2|]^{-1} \quad (B2)$$

In an example embodiment, capacitors and inductors can be realized using lumped elements when the circuit is operating at low frequency, because at low frequency it is possible to use components with a good quality factor. At higher frequencies, capacitors and inductors can also be realized using a transmission line with a finite length.

The disclosed circuit includes at least two resonators connected with a gyrator for EPDs of order 2. Negative inductance or negative capacitance may be designed via simple circuitry involving operational amplifiers. The gyrator may be designed via simple circuitry involving operational amplifiers.

The resonance frequency shift of such circuits may be read with high impedance probes when the circuit is started by an initial condition. An initial condition may be a charge deposited on a capacitor, e.g., a capacitor of one of the LC loops. The resonance frequencies may also be observed using the reflection coefficient concept. The advantages of a circuit with an EPD are (i) enhanced sensitivity compared to circuits used in conventional sensors, based on observing a frequency shift in a conventional resonator not working at the EPD condition; (ii) simplicity of the design implying ease of fabrication and consequent low cost.

Dramatically enhanced capabilities of the circuits combined with expected low costs and a wide range of applications may make them into valuable commercial products.

In some embodiment, the circuit may be as in FIG. 1 or equivalent circuits, e.g., circuits where the EPD can be reduced to the circuit in FIG. 1. The two series LC loops may be connected by a gyrator. In some embodiment, each negative (L and C) reactance of the series resonator may be built using circuits with operational amplifiers; the gyrator may also be implemented using operational amplifiers. In some other embodiment, the whole series LC resonator may be made of two negative reactances. The circuit may be implemented by using operational amplifiers to realize an inverter of a resonator made of positive inductors and capacitors, e.g., real world inductors and capacitors.

In some embodiments, the circuit may be as in FIG. 2 or equivalent circuits, e.g., circuits where the EPD can be reduced to the circuit in FIG. 2. The two parallel LC loops may be connected by a gyrator. As in the previous case, in some embodiments, each negative (L and C) reactance of the parallel resonator may be built using circuits with operational amplifiers; the gyrator may also be implemented using operational amplifiers. In some other embodiments, the whole parallel LC resonator may be made of two negative reactances that may be implemented by using operational amplifiers to realize an inverter of a resonator made of positive L and C.

A set of values of the circuit charges and the circuit charges derivatives relative to the circuit geometries in FIG. 1 and FIG. 2 may be referred to as circuit state.

The roots, s, of the characteristic equation in Eq. (A0) or Eq. (B0) may be referred to as eigenvalues. The corresponding radian frequency $\omega = -js$, where j is the imaginary unit may be referred to as angular eigenfrequencies. In an example embodiment, there may be four eigenvalues and eigenfrequencies counting the multiplicity eigenvalues and the corresponding eigenfrequencies. When some of the eigenvalues coincide, e.g., $s_1 = s_2$, $s_1$ may be referred to as a degenerate eigenvalue. The same definition may be applied to eigenfrequencies.

A circuit EPD may be any set of the values of the circuit's parameters, namely capacitances $C_1$, $C_2$, inductances $L_1$, $L_2$ and the gyration resistance $R_g$, for which at least one one of the circuit's eigenfrequencies $\omega$ may be degenerate. Then, in an example, there may be two degenerate eigenfrequencies, $\omega$ (with $\omega \neq 0$) and $-\omega$, assuming losses are negligible.

The circuit element which is altered by the measurement may be referred to as sensor related element. Any circuit element may be used as sensor related, e.g., any of the circuit parameters, namely capacitances $C_1$, $C_2$, inductances $L_1$, $L_2$ and the gyration resistance $R_g$, can be perturbed by a sensing scheme.

Any of the above parameters may be denoted by X Any of the parameters X (capacitances $C_1$, $C_2$, inductances $L_1$, $L_2$ and the gyration resistance $R_g$) may be perturbed and used for sensing, and by X' the perturbed value of X that may be detected by the proposed measuring scheme. When the circuit is operating at an EPD with the relevant value X, it is altered when X changes to another value X', which is indeed the value that needs to be detected by measurements. We introduce the corresponding relative deviation $\Delta(X) = (X'-X)/X$ In an example, when $X = C_1$, then $\Delta(C_1) = (C'_1 - C_1)/C_1$. In another example, when $X = C_2$, then $\Delta(C_2) = (C'_2 - C_2)/C_2$. In another example, when $X = L_1$, then $\Delta(L_1) = (L'_1 - L_1)/L_1$. In another example, when $X = L_2$, then $\Delta(L_2) = (L'_2 - L_2)/L_2$ When the circuit is at an EPD point, the corresponding degenerate angular frequency $\omega$ has multiplicity 2 and the circuit's operation is altered when perturbed. The perturbation $\Delta(X)$ is determined by measurements, observing that the $\omega$ (associated to the unperturbed circuit) splits into two frequencies $\omega_+$ and $\omega_-$. The difference $\omega_+ - \omega_-$ may be referred to as frequency split and $(\omega_+ - \omega_-)/\omega$ may be referred to as relative frequency split.

The relative frequency split can be related to the measured value of the sensor related element. For instance, when the sensor related element is $C_1$, this relation takes the form $$\frac{\omega_+ - \omega_-}{\omega} \approx \sqrt{-\left(\frac{\omega_{01}}{\omega_{02}} - 1\right) \Delta(C_1)} \quad (D1)$$

under an assumption that $\Delta(C_1) \ll 1$. Similar relations hold for other sensor related elements, [3]. To provide for the circuit stable operation, the expression under the square root in Eq. (D1) must positive. A way to achieve the stable operation, that is when frequencies $\omega^+$ and $\omega^-$ are real valued, is as follows. Suppose that:

$$\omega_{01} = \frac{1}{\sqrt{L_1 C_1}} > \omega_{02} = \frac{1}{\sqrt{L_2 C_2}} \quad (D2)$$

and let us represent $\Delta(C_1)$ as the sum of two quantities $$\Delta(C_1) = w + x \quad \text{with} \quad \left(\frac{\omega_{01}}{\omega_{02}} - 1\right) w < 0, \quad |x| \le \frac{|w|}{2}, |w| \ll 1 \quad (D3)$$

As used herein, a work point may be the quantity w in relations (D3) under assumption $-(\omega_{01}/\omega_{02}-1)$ w>0. The quantity w is referred to as the work point. Notice that w=0 corresponds to the EPD point. The utility of w is to provide an assurance that $-(\omega_{01}/\omega_{02}-1)\Delta(C_1)>0$ with the consequent stability enforced. We refer to the state of the circuit as in relations (D3) with x=0 as the work state. The work point and work state for other sensor related elements are defined similarly. The alteration of $\Delta(C_1)$ related to the measurement is captured by x.

The circuit state before the measurement may be the work state, e.g., the work point. Additionally, when one chooses a circuit element X to be sensor related the preferred choice may be when X>0.

In an example, the chosen sensor related element is $X=C_1$. Then to provide for stronger enhancement of the sensed quantity, the EPD point should be chosen so that $\omega_1 > \omega_2$ where the indicated frequencies are defined in relations (D1).

In an example embodiment, a sensor may operate at, or close to, an exceptional point of degeneracy. The circuit may operate in the vicinity of an exceptional points of degeneracy because commercial components may often be available with accuracies within 1% or even 5%, or with some other tolerance. The tolerances may, for example, result in operation within, e.g., 5% vicinity of the exceptional point. A system operating near an exceptional point may retain most of the high sensitivity properties. To check if a system is close to an exceptional point, the distance between two normalized eigenvectors may be calculated and quantified. A system may be considered close to an exceptional point when the distance from the exceptional point of degeneracy is less than 0.4, i.e., when measuring the angle between two normalized eigenvectors.

One or more of the components, steps, features, and/or functions illustrated in the figures may be rearranged and/or combined into a single component, block, feature, or function or embodied in several components, steps, or functions. Additional elements, components, steps, and/or functions may also be added without departing from the disclosure. The apparatus, devices, and/or components illustrated in the Figures may be configured to perform one or more of the methods, features, or steps described in the Figures. The algorithms described herein may also be efficiently implemented in software and/or embedded in hardware.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The foregoing description of the embodiments of the present invention has been presented for the purposes of illustration and description. It is not intended to be exhaustive or to limit the present invention to the precise form disclosed. Many modifications and variations are possible in light of the above teaching. It is intended that the scope of the present invention be limited not by this detailed description but rather by the claims of this application. As will be understood by those familiar with the art, the present invention may be embodied in other specific forms without departing from the spirit or essential characteristics thereof. Likewise, the particular naming and division of the modules, routines, features, attributes, methodologies, and other aspects are not mandatory or significant, and the mechanisms that implement the present invention or its features may have different names, divisions, and/or formats.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims.

Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The invention claimed is:

1. A circuit comprising:
   a first inductor-capacitor (LC) loop;
   a second LC loop having at least one of a series connection or parallel connection to the first LC loop; and
   a gyrator coupled between the first LC loop and the second LC loop, wherein the first LC loop and the second LC loop each include an inductive element (L) and a capacitive (C) element coupled to each other in series.

2. The circuit of claim 1, wherein a circuit state before a measurement is a work state, wherein a quantity, w, in relations $$\Delta(C_1) = w + x \quad \text{with} \quad \left(\frac{\omega_{01}}{\omega_{02}} - 1\right)w < 0, \quad |x| \leq \frac{|w|}{2}, \quad |w| \ll 1$$

under assumption $-(\omega_{01}/\omega_{02}-1)$ w>0 is referred to as a work point, wherein w=0 corresponds to an exceptional point of degeneracy (EPD) point, and the parameter w is selected to ensure that $-(\omega_{01}/\omega_{02}-1) \Delta(C_1)>0$ thereby enforcing circuit stability near the exceptional point of degeneracy, where $C_1$ is a capacitance, $\omega_{01}$ is an angular resonance frequency, $\omega_{02}$ is an angular resonance frequency, wherein the work state is defined as a steady-state operating condition of the circuit immediately prior to the measurement event, wherein the circuit state refers to a configuration of the circuit defined by the values of capacitive and inductive elements therein and an operating frequency thereof.

3. The circuit of claim 1, wherein a circuit parameter, X, corresponding to a sensor element, is greater than zero.

4. The circuit of claim 1, wherein an exceptional point of degeneracy (EPD) point is chosen so that $$\omega_{01} = \frac{1}{\sqrt{L_1 C_1}} > \omega_{02} = \frac{1}{\sqrt{L_2 C_2}}.$$

where $L_1$ is an inductance of the first LC loop, $L_2$ is an inductance of the second LC loop, $C_1$ is a capacitance of the first LC loop, $C_2$ is a capacitance of the second LC loop, $R_g$ is a resistance of the gyrator, $\omega_{01}$ is an angular resonance frequency of the first LC loop, and $\omega_{02}$ is an angular resonance frequency of the second LC loop.

5. The circuit of claim 2, wherein the first LC loop, the second LC loop, and the gyrator are configured such that parameters of the circuit satisfy:

$sgn(\omega_{01}^2)=sgn(\omega_{02}^2)=-sgn(L_1L_2)=\pm 1$ and $R_g^2=(|\omega_{01}|\pm|\omega_{02}^{-1}|)^2|L_1L_2|$, where $L_1$ is an inductance of the first LC loop, $L_2$ is an inductance of the second LC loop, $C_1$ is a capacitance of the first LC loop, $C_2$ is a capacitance of the second LC loop, Re is a resistance of the gyrator, $\omega_{01}$ is an angular resonance frequency of the first LC loop, and $\omega_{02}$ is an angular resonance frequency of the second LC loop.

6. The circuit of claim 5, wherein the first LC loop comprises a first inductive element and a first capacitive element, of positive values, wherein a second LC loop comprises a second inductive element and a second capacitive element, of negative values, wherein the gyrator couples the first LC loop and the second LC loop.

7. The circuit of claim 5, wherein the first LC loop comprises a first inductive element and a first capacitive element, one with a positive value while the other has a negative value, wherein the second LC loop comprises a second inductive element and a second capacitive element, one with a positive value while the other has a negative value, wherein the gyrator couples the first LC loop and the second LC loop.

8. The circuit of claim 2, wherein the first LC loop, the second LC loop, and the gyrator are configured such that an evolution matrix of the circuit exhibits a condition close to a Jordan canonical form.

9. The circuit of claim 2, wherein equivalent inductances and capacitances are frequency dependent and at a specific frequency they satisfy:

$sgn(\omega_{01}^2)=sgn(\omega_{02}^2)=-sgn(L_1L_2)=\pm 1$ and $R_g^2=(|\omega_{01}|\pm|\omega_{02}^{-1}|)^2|L_1L_2|$, where $L_1$ is an inductance of the first LC loop, $L_2$ is an inductance of the second LC loop, Ro is a resistance of the gyrator, $\omega_{01}$ is an angular resonance frequency of the first LC loop, and $\omega_{02}$ is an angular resonance frequency of the second LC loop.

10. The circuit of claim 1, including additional inductors and/or additional capacitors and configured to behave equivalently to a two-loop LC-gyrator configuration over a target frequency range including an exceptional point of degeneracy (EPD).

11. A sensor whose electronic circuits comprise:
a plurality of LC loops; and
a gyrator coupled between a first LC loop and a second LC loop of the plurality of LC loops, wherein an inductance and a capacitance of each of the plurality of LC loops and a gyrator resistance is selected such that the sensor operates at, or close to, an exceptional point of degeneracy.

* * * * *